United States Patent [19]

Seitz

[11] Patent Number: 4,749,939
[45] Date of Patent: Jun. 7, 1988

[54] MEASURING TRANSFORMER FOR MEASURING OF A CURRENT FLOWING IN AN ELECTRICAL CONDUCTOR

[75] Inventor: Thomas Seitz, Zug, Switzerland
[73] Assignee: LGZ Landis & Gyr Zug, Zug, Switzerland
[21] Appl. No.: 872,712
[22] Filed: Jun. 9, 1986

[30] Foreign Application Priority Data

Feb. 10, 1986 [CH] Switzerland ............... 00518/86

[51] Int. Cl.$^4$ ............... G01R 1/20; G01R 33/00; G01R 19/00
[52] U.S. Cl. ............... 324/117 H; 324/127; 324/251
[58] Field of Search ............... 324/117 H, 127, 251; 323/294, 368; 307/309

[56] References Cited

U.S. PATENT DOCUMENTS 3,885,212 5/1975 Herbert ............... 324/117 H
4,124,821 11/1978 Petr ............... 328/151
4,394,619 7/1983 Gschwandtner ............... 324/117 H

OTHER PUBLICATIONS

Barlow, H. E. M.; "The Application of the Hall Effect . . . "; Proceedings of the Institute of Electrical Engineers (Great Britain); Mar. 1955; pp. 179–185; copy in 324–117 H.
Hallgeneratoren, Eigenschaften und Anwendungen, F. Kuhrt and H. J. Lippmann, Springer Verlag, 1968, pp. 10–11, pp. 267–275.

Primary Examiner—Ernest F. Karlsen
Attorney, Agent, or Firm—Marmorek, Guttman & Rubenstein

[57] ABSTRACT

A measuring transformer for measuring a current flowing in an electrical conductor is disclosed. Illustratively, the transformer comprises a three legged ferromagnetic core whose center leg at least partially surrounded by the electrical conductor. The center leg defines a center air gap and two outer air gaps, the center gap containing a magnetic field snesor and one outer gap being located at each end of the center leg. The two outer gaps are longer than the center gap when measured in the longitudinal direction of the center leg. The center leg and the magnetic sensor may form a single construction element. This configuration permits an especially precise, simple, and dependable installation of the measuring transformer, without worsening non-linearities or phase errors, while improving air-gap tolerances.

19 Claims, 3 Drawing Sheets

A−B

C−D

MEASURING TRANSFORMER FOR MEASURING OF A CURRENT FLOWING IN AN ELECTRICAL CONDUCTOR

FIELD OF THE INVENTION

The invention relates to a measuring transformer for measuring a current flowing in an electrical conductor.

BACKGROUND OF THE INVENTION

Measuring transformers of this kind are, for instance, used to find an instantaneous power delivered to a user. In this case, the instantaneous value of an electrical current is measured and after this multiplied with the instantaneous value of a supply voltage. Preferably, the multiplication occurs through use of a Hall element that exists within the transformer used to measure the current.

An arrangement of the above mentioned type is described in the book Hallgeneratoren, Eigenschaften und Anwendungen, F. Kuhrt and H. J. Lippmann, Springer Verlag, 1968, pages 10 through 11 and pages 267 through 275.

The invention has as its object to create a measuring transformer, the installation of which is especially precise, simple and dependable, and which exhibits improved air gap tolerances, without worsening non-linearities or increasing phase errors.

SUMMARY OF THE INVENTION

The present invention is a measuring transformer for measuring a current flowing in an electrical conductor. Illustratively, the transformer comprises a three legend ferromagnetic core whose center leg is at least partially surrounded by the electrical conductor. The center leg defines a center air gap and two outer air gaps, one outer air gap being located at each end of the center leg. The center air gap contains a magnetic field sensor. The two outer gaps are longer than the center gap when measured in the longitudinal direction of the center leg. The center leg and the magnetic sensor may form a single construction element. This configuration permits an especially precise, simple, and dependable installation of the measuring transformer, without worsening non-linearities or phase errors, while improving air-gap tolerances.

BRIEF DESCRIPTION OF THE DRAWINGS

The same reference numbers characterize the same parts in all figures.

DETAILED DESCRIPTION OF THE INVENTION

Figure 1:
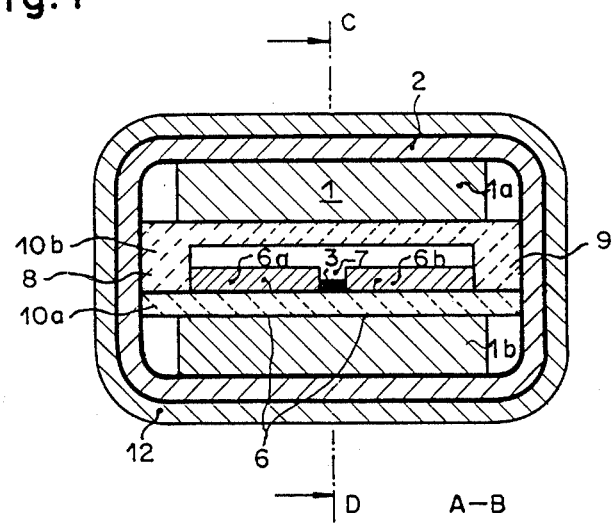
FIG. 1 shows a first cross-section A-B of a first embodiment of the inventive measuring transformer.
Figure 2:
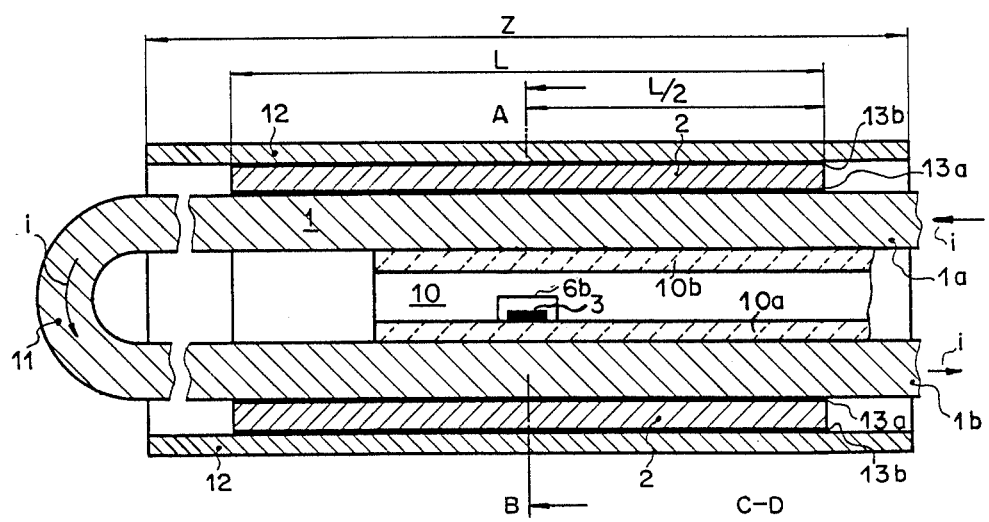
FIG. 2 shows a second cross section C-D of the measuring transformer of FIG. 1.

The measuring transformer for measurement of the current flowing in an electrical conductor shown in FIGS. 1 and 2 comprises a three legged ferromagnetic core 2;6 and a magnetic field sensor 3 that preferably is a Hall element. The ferromagnetic core 2;6 preferably comprises a ring 2 and a center leg 6.

The upper and lower portion of the ring 2 shown in FIG. 1 form the two outer legs and the two side areas of the ring 2 form the yoke of the three-legged ferromagnetic core 2;6, the yoke then connects the three legs together at their two ends. Suitable as material for the ferromagnetic core 2;6 is preferably, because of its high permeability, an iron-nickel alloy as, for instance, permenorm, vacoperm, trafoperm, permax, ultraperm or mumetal.

As shown in FIG. 1, the center leg 6 defines at least three air gaps 7, 8 and 9. The center air gap 7 contains the magnetic field sensor 3. The two outer air gaps 8 and 9 are each positioned at one of the two ends of the center leg 6. The length of the center gap 7 is, when measured in the longitudinal direction of the center leg 6 (i.e. in the direction of the arrows of FIG. 1), almost equal to the dimension of the magnetic field sensor 3 measured in the same direction. Thus, this length is defined exactly by this dimension of the magnetic field sensor 3. Each one of the two outer air gaps 8 and 9 is, when measured in the longitudinal direction of the center leg 6, preferably longer than the center air gap 7.

The center leg 6 preferably comprises two flat sheet-metal strips 6a and 6b that are, together with the magnetic field sensor 3, arranged in a case 10 made out of a non-ferromagnetic material, such as ceramic. The case 10 has preferably a bottom 10a and a case top 10b. The center leg 6 and the magnetic field sensor 3 are arranged on a carrier made out of insulating material. The bottom 10a of the case 10 forms the carrier, on which additional elements may be mounted. This allows a simple, precise and dependable installation of the magnetic field sensor 3 and of the center leg 6. Illustratively, the center leg 6 and the magnetic sensor 3 form a single construction element.

The two outer air gaps 8 and 9 are each filled with one wall of the case 10, so that their air gap length (in the direction of the arrows of FIG. 1) can be defined by the wall-thickness of the case 10. The ring 2 comprises at least one sheet bent in the shape of a ring to simplify its production. Preferably, the length L of the ring 2 (see FIG. 2) is larger than any internal dimension, so that the ring screens the magnetic field sensor 3 very well against the effect of external foreign magnetic fields $\vec{H}_a$. Note that the length L of the ring 2 is measured in a direction perpendicular to the longitudinal direction of the leg 6.

The electrical conductor 1 preferably has a rectangular cross-section. Preferably, the ring 2 has an approximately rectangularly-shaped annular cross-section (see FIG. 2). The center leg 6 is at least partially surrounded by the electrical conductor 1 and preferably arranged between outgoing and return conducting paths 1a and 1b of the electrical conductor 1 that are parallel to and nearby each other. The electrical conductor 1 forms, for instance, a U-shaped loop 11 (see FIG. 2). The outgoing and return conducting paths of this loop 11 are the parallel outgoing and return conducting paths 1a and 1b of the electrical conductor 1. The rectangular cross-section of the electrical conductor 1 is, for instance, 2 mm by 10 mm for a current i of 100A. If, for instance, a Hall element that measures magnetic fields oriented perpendicular to its surface, is used as the magnetic field sensor 3 then the magnetic field sensor 3 fills up totally the air gap 7. However, if a Hall element is used that measure magnetic fields oriented parallel to its surface, then the magnetic field sensor 3 only fills up, for instance, the lower half (see FIG. 1) of the air gap 7.

The length of the air gap 7 is, for instance, 0.6 mm and the length of the outer air gaps 8 and 9 is about 1.7 mm. Within or outside of the case 10a; 10b, additional electronic components (not shown) that, for instance, are connected with the magnetic field sensor 3, may be arranged on the carrier.

In FIG. 1, it was assumed that the width of the case 10 is bigger than the width of the electrical conductor 1. Thus, in the cross section A-B (FIG. 1), the case 10, for instance, fills up the space between the outgoing and return conducting paths 1a and 1b of loop 11 completely. The width of the case 10 may also equal or be less than the width of the electrical conductor 1. In the latter case, in the cross section A-B, the case 10 fills up the space between the outgoing and return conducting paths 1a and 1b of the loop 11 only partially. However, as shown in FIG. 2, the ring 2 of length L surrounds the outgoing and return conducting paths 1a and 1b of the loop 11 in such a manner, that the center leg 6, is located, in the middle, approximately L/2 from either the front or back end of the ring 2. The outgoing and return conducting paths 1a and 1b of loop 11 cross the space between case 10 and the ring 2 in such a manner, that, if possible, they have spatial contact with case 10a;10b and also electrically insulated spatial contact with the ring 2. Between the ring 2 on one hand and the outgoing and return conducting paths 1a and 1b of loop 11 on the other hand, an insulating layer 13a thus exists (see FIGS. 1 and 2).

The ring 2 is preferably surrounded completely on its surface by an almost parallel ring-shaped outer shield 12. Between the ring 2 and the outer shield 12, for instance, an insulating layer 13b exists. The outer shield 12 has a length Z that is longer than the length L of the ring 2, so that the front and back ends of the ring are still partially shielded. The length Z is, for instance, 30 mm. The outer shield 12 is, illustratively, made out of deep-drawing cold rolled steel or an iron-nickel alloy. The insulating layer 13b between ring 2 and the outer screening 12 serves also to enlarge the space between the two, which improves the shielding effect of the outer shield 12. This space is, for instance, 0.05 mm. It is the object of the outer shield 12 to relieve the highly permeable, but easily saturated ring 2, which is also effective as a shield, when the external foreign magnetic fields $H_1$ are strong. The ring 2 and the outer shield 12 thus work as a double shield. Without the outer shield 12, the shield formed by the ring 2 remains unsaturated up to a value of the external foreign magnetic fields $\vec{H}_a$ of approximately 50A/cm. When the double shield exists, the shield formed by the ring 2 remains unsaturated up to a value of the external foreign magnetic field $\vec{H}_a$ of approximately 200A/cm.

If an iron-nickel alloy is used for the core 2;6, the decrease in magnetic tension n the ferromagnetic material can be neglected in comparison to the decrease in magnetic tension at the gaps 7, 8 and 9. Accordingly, non-linearities, phase errors and the temperature coefficient of the highly permeable material effect the measuring transformer only slightly. The arrangement of the center leg 6 and the magnetic field sensor 3 on a carrier and/or in a case 10 allows an especially precise, simple and dependable installation of the measuring transformer. The usage of three air gaps 7, 8 and 9 permits the concentration of tolerance problems of the air gaps in the two outer air gaps 8 and 9, where they disrupt the least, since in the outer air gaps 8 and 9 the magnetic flux lines are no longer packed parallel and close. Instead the flux lines have already partially separated as they make their way through the air space that is bordering the ferromagnetic core. The stronger the separation of the magnetic flux lines is, i.e. the longer the outer air gaps 8 and 9 are, the smaller are these tolerance problems.

The second and third embodiment of the invention differ from the first embodiment of the invention by the shape of the electrical conductor 1.

Figure 3:
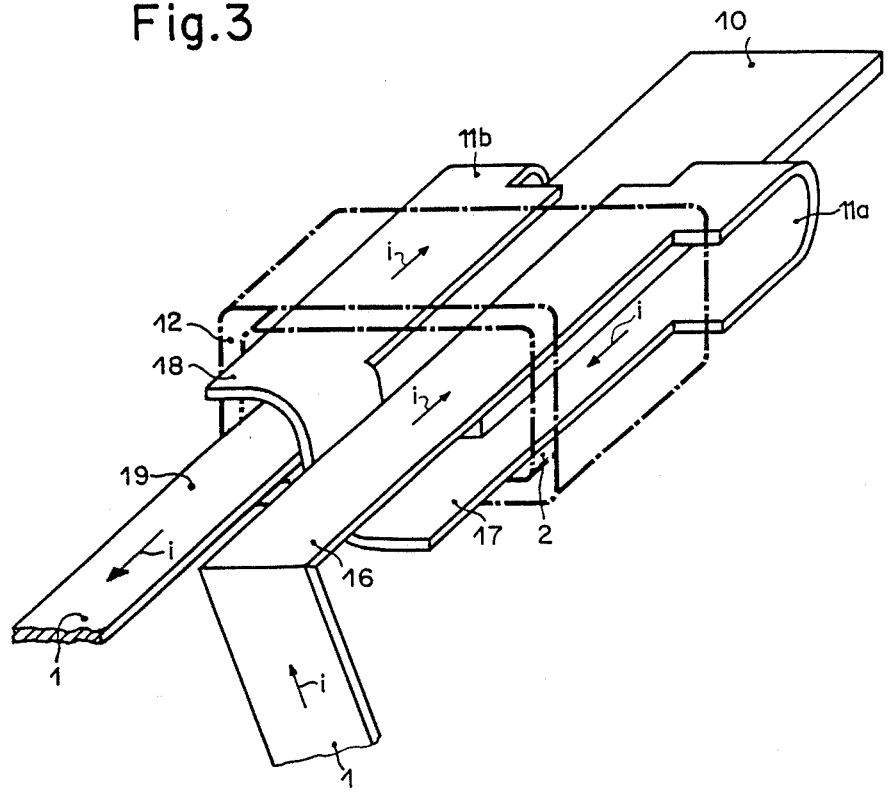
FIG. 3 shows a second embodiment of the inventive measuring transformer.

In the arrangement shown in FIG. 3, the electrical conductor 1 forms at least two U-shaped loops 11a and 11b that are positioned adjacent and parallel to one another and are connected electrically in series. The conductors 16, 17, and 18, 19 of each loop 11a, 11b respectively are equal in dimensions and aligned parallel to each other. The two outgoing conducting paths 16 and 18 on one hand and the two return conducting paths 17 and 19 on the other hand of the two loops 11a and 11b are each arranged in the same plane next to each other. The case 10 and thus also the center leg 6 with the magnetic field sensor 3 are arranged between the plane containing the two outgoing conducting paths 16 and 18 and the plane containing the two return conducting paths 17 and 19. The outgoing and return conducting paths are located in the vicinity of the case 10. The ring 2 and, if existing, the outer shield 12 surround, the two U-shaped loops 11a and 11b. The arrangement allows the excitation of the core with half the current, for instance, with 50A, without changing the configuration of the core and the case 10. This half current produces, with two loops 11a and 11b, a magnetic field H equally big as the current i with one single loop 11.

Alternatively, the U-shaped loops 11a and 11b can also be arranged so that both U-shaped loops are aligned and one U-shaped loop is embraced by the other. In this case, the two outgoing conducting paths 16 and 18 on one hand and the two return conducting paths 17 and 19 on the other hand are arranged coinciding on top of each other instead of next to each other. The outgoing and return conducting paths 16 through 19 can then be almost twice as wide and half as thick.

Figure 4:
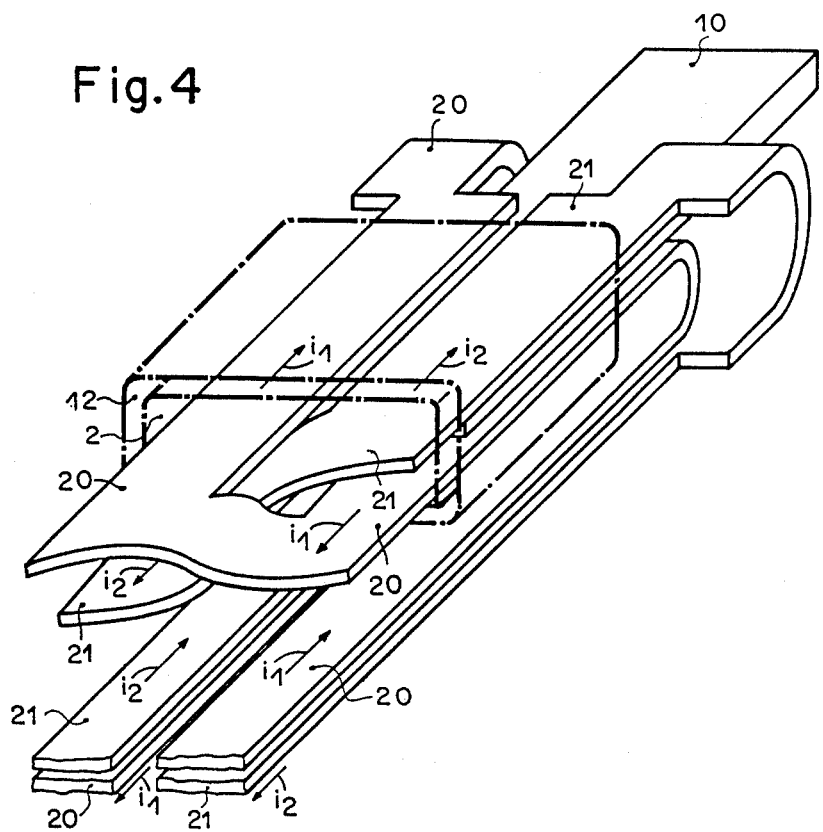
FIG. 4 shows a third embodiment of the inventive measuring transformer.

In the third embodiment of the invention shown in FIG. 4, the electrical conductor 1 comprises two conductors 20 and 21. The conductors 20 and 21 each traverse the ring 2 first in one direction, then the two conductors crossover and finally each conductor 21 and 20 traverses the ring 2 again in the opposite direction. Within the ring 2, the two conductors 20 and 21 are parallel. At the intersection point, the two conductors are electrically insulated. For both directions the case 10 and the center leg 6 are arranged between the two conductors 20 and 21. The two conductors 20 and 21 are, for instance, aligned one on top of the other. An outer shield 12 again surrounds the ring 2.

The above-described arrangement is, for instance, used in electrical meters of the U.S.A. and permits excitation of the core 2;6 with two independent one-phase currents $i_1$ and $i_2$ of, for instance, 200 A each without changing the configuration of the case 10 and the ferromagnetic core 2;6. In an extreme case, one of the two currents $i_1$ or $i_2$ may then equal zero. Such a construction of the conductor 20 and 21 allows the equalization of the transmission constants of the two currents $i_1$ and $i_2$.

Finally, the above described embodiments of the invention are intended to be illustrative only. Numerous, alternative embodiments may be derived by those skilled in the art, without departing from the spirit and scope of the claims which follow.

What is claimed is:

1. A measuring transformer for a current flowing in an electrical conductor comprising:
   a three-legged ferromagnetic core whose center leg is at least partially surrounded by said conductor, said center leg defining a center air gap and two outer air gaps, the center air gap containing a magnetic field sensor, and one outer gap being located at each end of said center leg, said center leg and magnetic sensor being formed as a unitary construction element, the two outer gaps being longer than the center air gap when measured in the longitudinal direction of the center leg.

2. A measuring transformer of claim 1 wherein the center leg comprises two flat sheet-metal strips that, together with the magnetic field sensor, are arranged in a case made out of non-ferromagnetic material, and wherein each outer air gap is filled by one wall of the case.

3. A measuring transformer of claim 1 wherein said transformer includes a yoke and wherein the two outer legs of the ferromagnetic core and said yoke are formed by a ring that comprises at least one sheet bent in ring-shape.

4. A measuring transformer of claim 1, characterized by the length (L) of the ring being bigger than its biggest internal dimension.

5. A measuring transformer of the claim 1 wherein the length of the center air gap, if measured in the longitudinal direction of the center leg, is almost equal to the dimension of the magnetic field sensor measured in the same direction.

6. A measuring transformer of the claim 3, wherein the electrical conductor has a rectangular cross-section and the ring is rectangular.

7. A measuring transformer of claim 1, wherein the center leg is arranged between an outgoing path and a return path of the electrical conductor, said paths being parallel to each other.

8. A measuring transformer of claim 7 wherein the electrical conductor forms a U-shaped loop.

9. A measuring transformer of claim 1 wherein the electrical conductor forms at least two U-shaped loops that are arranged parallel to each other and connected electrically in series, each loop comprising an outgoing conducting path and a return conducting path, both conducting paths of each loop being arranged parallel one on top of the other and the two outgoing conducting paths and the two return conducting paths of the two loops each being arranged next to each other in the same plane and the center leg being arranged with the magnetic field sensor between the plane containing the two outgoing conducting paths and the plane containing the two return conducting paths.

10. A measuring transformer of claim 1 wherein the electrical conductor forms at least two coincident and series connected U-shaped loops, one U-shaped loop embracing the other, each loop having an outgoing conducting path and an incoming conducting path, said center leg and magnetic field sensor being arranged between two outgoing conducting paths and two incoming conducting paths.

11. A measuring conductor of claim 3 wherein the electrical conductor comprises, at least within the ring, two parallel conductors wherein each of the two conductors first cross the ring in one direction, then, electrically insulated, the two conductors cross over and each conductor crosses the ring again in the opposite direction, the center leg being arranged between the two conductors.

12. A measuring conductor of claim 1 wherein the center leg and the magnetic field sensor being arranged on a carrier made out of insulating material.

13. A measuring transformer of claim 2 wherein the carrier is a bottom portion of a case comprising top and bottom portions.

14. A measuring transformer of claim 2 wherein the case is made out of ceramic.

15. A measuring transformer of claim 1 wherein the ferromagnetic core is made out of an iron-nickel alloy.

16. A measuring transformer of claim 3 wherein the ring, on its surface, is surrounded by an outer shield.

17. A measuring transformer of claim 16 wherein the outer shield is made out of cold rolled steel.

18. A measuring transformer of claim 16 wherein the outer shield is made out of an iron-nickel alloy.

19. A measuring transformer of claim 16 wherein a space exists between the ring and the outer shield.

* * * * *